(12) United States Patent
Shields

(10) Patent No.: US 8,530,881 B2
(45) Date of Patent: Sep. 10, 2013

(54) OPTICAL DEVICE AND METHOD FOR ITS MANUFACTURE

(75) Inventor: Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/037,006

(22) Filed: Feb. 28, 2011

(65) Prior Publication Data

US 2011/0149364 A1  Jun. 23, 2011

Related U.S. Application Data

(62) Division of application No. 09/949,645, filed on Sep. 12, 2001, now Pat. No. 7,915,604.

(30) Foreign Application Priority Data

Sep. 11, 2000 (GB) .................................. 0022208.3

(51) Int. Cl.
*H01L 33/00* (2010.01)

(52) U.S. Cl.
USPC ........................................ 257/9; 257/E33.069

(58) Field of Classification Search
USPC ................... 257/9, 10, 11, 12, 13, 14, 15, 17, 257/18, 98, E33.001, E33.055, E33.067, 257/E33.068, E33.069; 372/19, 20, 43, 45, 372/46, 64, 97
See application file for complete search history.

(56) References Cited

U.S. PATENT DOCUMENTS

| | | | |
|---|---|---|---|
| 5,314,838 A | 5/1994 | Cho et al. | |
| 5,440,421 A | 8/1995 | Fan et al. | |
| 5,477,377 A | 12/1995 | Golding et al. | |
| 5,627,854 A | 5/1997 | Knox | |
| 5,719,891 A | 2/1998 | Jewell | |
| 5,734,174 A | 3/1998 | Horiguchi | |
| 5,946,438 A | 8/1999 | Minot et al. | |
| 5,991,326 A | 11/1999 | Yuen et al. | |
| 6,233,039 B1 | 5/2001 | Yen et al. | |
| 6,376,864 B1 | 4/2002 | Wang | |
| 6,711,200 B1 * | 3/2004 | Scherer et al. | 372/64 |

OTHER PUBLICATIONS

G.S. Solomon, et al. "Modification of Spontaneous Emission of a Single Quantum Dot," Phys. Stat. Sol. (A), 178, 2000, pp. 341-344.
Noriaki Tsurumachi, et al. "Time Response of One-Dimensional Photonic Crystals with a Defect Layer Made of Semiconductor Quantum Dots," Jpn. J. Appl. Phys., vol. 38, Part 2, No. 12A, Dec. 12, 1999pp. L1400-L1402.

(Continued)

*Primary Examiner* — Michael Lebentritt
*Assistant Examiner* — Kevin Quinto
(74) *Attorney, Agent, or Firm* — Oblon, Spivak, McClelland, Maier & Neustadt, L.L.P.

(57) ABSTRACT

An optical device which can operate as a single photon emitter 1, comprising a three dimensional optical cavity 7 which spatially confines a photon to the order of the photon wavelength in all three dimensions. The cavity 7 is configured to define preferred emission direction for photons entering the cavity. A photon can be supplied to the cavity using a quantum dot 5. Strong coupling can occur between the cavity 7 and the quantum dot 5 which causes the formation of two hybridised modes. Switching on an off the coupling by irradiating the device with radiation having an energy equal to that of one of the hybridised modes allows the device to act as an optical switch.

9 Claims, 12 Drawing Sheets

(56) References Cited

OTHER PUBLICATIONS

C. L. Foden, et al. "High-Frequency Acousto-electric Single-photon Source," The American Physical Society Physical Review A, vol. 62, 2000, pp. 11803-1-11803-4.

J. M. Gerard, et al. Quantum boxes as active probes for Photonic Microstructures: The Pillar Microcavity Case: American Institute of Physics, Applied Physics Letters, 69 (4), Jul. 22, 1998, pp. 449-451.

C. J. M. Smith, et al. "Near-infrared Microcavities Confined by Two-dimensional Photonic Bandgap Crystals," Electronics Letters, vol. 35, No. 3, Feb. 4, 1999, pp. 228-231.

* cited by examiner

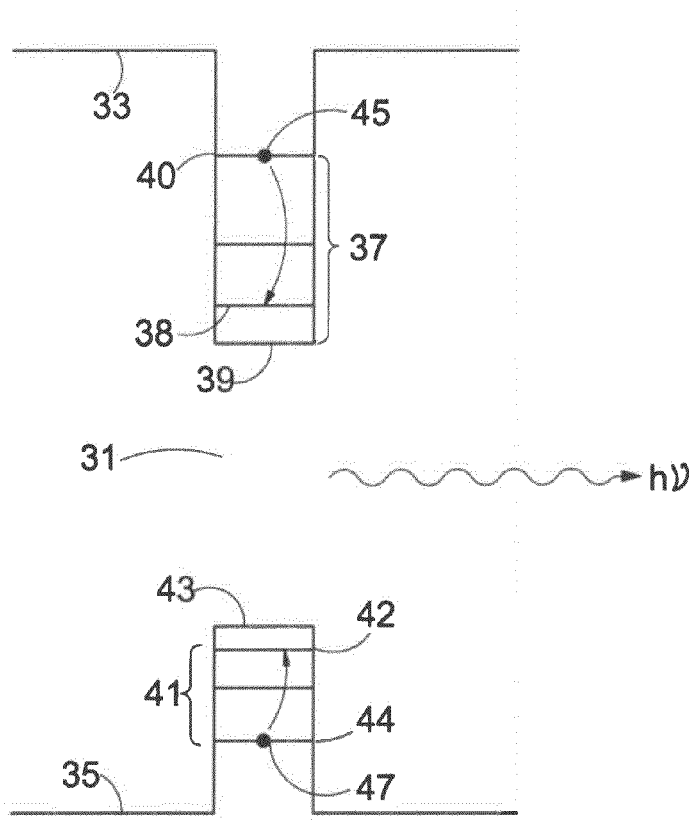
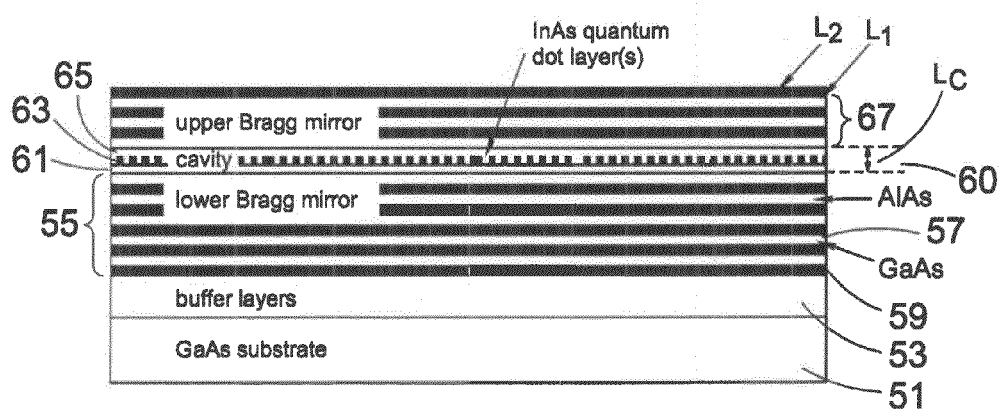

OPTICAL DEVICE AND METHOD FOR ITS MANUFACTURE

CROSS-REFERENCE TO RELATED APPLICATIONS

This application is a divisional of and claims the benefit under 35 U.S.C. §120 from U.S. application Ser. No. 09/949,645, filed on Sep. 12, 2001, the entire content of which is incorporated here by reference. U.S. application Ser. No. 09/949,645 claims priority under 35 U.S.C. §119 from Great Britain Patent Application No. 0022208.3 filed Sep. 11, 2000.

BACKGROUND OF THE INVENTION

The present invention relates to an optical device which can be configured as a source which emits single or multiple photons at a predetermined time or which can be configured as an optical switch.

As an optical source, the device is capable of emitting pulses of n-photons where n is controllable and is an integer of at least 1. More specifically, the present invention is concerned with such a device which has means for directing photons such that they can be efficiently collected by an external medium such as a fibre optic cable and a method of making such a device. The present invention can be used to increase the efficiency of any light emitter.

There is a growing need for single photon sources for use in optical quantum cryptography where, for example, a security key for an encryption algorithm is delivered by a stream of single photons which are regularly spaced in time. It is essential for the security of this technique that each bit is encoded on just a single photon. This is because an eavesdropper trying to intercept the key will be forced to measure and thereby alter some photons while reading the key. Therefore, the intended recipient of the key can tell if the key has been intercepted.

Such a source is also useful as a low-noise source for optical imaging, spectroscopy, laser ranging and metrology. Normal light sources suffer from random fluctuations in the photon emission rate at low intensities due to shot noise. This noise limits the sensitivity of many optical techniques where single photons are detected. A single photon source which produces photons at regular time intervals has a reduced shot noise.

Previously, single photon sources have been envisaged by strongly attenuating a beam emitted from a pulsed laser source. Such a source is shown in FIG. 16. Emitted beam 101 is fed through an attenuator 103. The attenuator is configured so that the average number of photons transmitted (0 is about 0.1. Since photons are indivisible, this means that about 10% of the periods will contain a single photon, while 90% of them are empty.

This method has two serious drawbacks. First, there is still a small probability ($\mu^2/2$) of finding more than one photon within one period. A significant number of these multi-photon emissions would seriously impinge on the security of the device for quantum cryptography. The second problem is that most of the periods are empty and hence carry no information. Thus, the time which it takes to send the key is increased, and also, the maximum distance over which it can be transmitted is limited. The distance limitation problem arises from the fact that optical quantum cryptography is only effective when the rate of detected photons is much higher than the 'dark count' rate of the detector. Therefore, a system with a high emission rate source can tolerate more transmission loss, and therefore a longer transmission distance medium before being overwhelmed by the detector dark count.

More promising attempts at making such a single photon detector have concentrated on controlling the generation of photons. For example, the inventor's unpublished UK patent application number 9927690.9 and J Kim et al, Nature, 397, p 500 (1999) have both suggested single photon emitters using a quantum box to control the recombination of electrons and holes. In the inventor's unpublished UK patent application, the emitter comprises a quantum dot having a first confined energy level capable of being populated by an electron and a second confined energy level capable of being populated by a hole, the emitter also comprises supply means for supplying carriers to the said energy levels, wherein the supply means are configured to supply a predetermined number of carriers to at least one of the energy levels to allow recombination of a predetermined number of carriers in said quantum dot to emit at least one photon. Foden et al, Phys. Rev. A. 62 011803 (R) (2000) have suggested a device where recombination of electrons and holes is controlled using Surface Acoustic Wave (SAW) to transport carriers through a quantising means prior to recombination.

However, although some advances have been made in controlling the generation of the photons, there is still a problem in that it is very difficult to efficiently collect photons generated by such a source.

In most single photon emitters, the photons are emitted essentially isotropically by the device. Thus, only a small fraction of the emitted photons can be collected by an optical fibre or the like and subsequently used. This problem, compounded by the fact that some of the known photon sources have poor emission efficiency, means that the total efficiency of the device can be as little as 0.01%.

The present invention attempts to address the above problems by using a three dimensional optical cavity, which confines the emitted photon field in three dimensions and allows the emission direction of photons leaving the cavity to be controlled.

Gerard et al, Applied Physics Letters, 69, p 449 (1996) describe an experiment which uses a quantum dot to probe the photonic microstructure of a three dimensional cavity which is formed in an etched pillar. This so-called pillar cavity is formed from a stack of alternating semiconductor layers which form Bragg reflectors provided above and below a light emitter. The stack of layers is then etched to form a pillar. The reflective etched outer surface of the pillar provides some lateral confinement However, this method of forming such a three dimensional cavity is flawed since the device exhibits poor confinement in the lateral direction due to the low reflectivity of the etched walls. Smith et al, Electronics Letters 35 228 (1999) have studied optical confinement using a photonic crystal.

SUMMARY OF THE INVENTION

The present invention attempts to address the above problems and, in a first aspect provides an optical device comprising:

photon generating means configured to generate photons at a photon generation portion; and directing means provided to direct photons generated by said generating means in a predetermined direction, said directing means comprising a three dimensional cavity for confining a photon such that the photon can only occupy a discrete number of optical modes in three dimensions, the three dimensional cavity being formed within a layer or a plurality of layers where confinement in at least one lateral dimension within the plane of the layers or layers is provided by a pattern of reflective interfaces, the three dimensional cavity being formed at an irregularity in the pattern, the photon generation portion being located within the three dimensional cavity or directly above or below the three dimensional cavity.

In a second aspect, the present invention provides an optical device comprising:

photon generating means configured to generate photons at a photon generation portion; and directing means provided to direct photons generated by said generating means in a predetermined direction, said directing means comprising a three dimensional cavity for confining a photon such that the photon can only occupy a discrete number of optical modes in three dimensions, optical confinement in one of the dimensions being non-symmetric such that optical confinement on a first side of the cavity is weaker than that of the opposite side to direct emission from the photon generating means out through the first side of the cavity, the three dimensional cavity being formed within a layer or a plurality of layers wherein confinement in at least one lateral dimension within the plane of the layers or layers is provided by a pattern of reflective interfaces, the three dimensional cavity being formed at an irregularity in the pattern.

For the avoidance of doubt and as used hereinafter, a generating portion is taken to mean the part of a photon generator where the photons are actually created. Typically, photons are generated by recombining electrons and hole. In these types of device the photon generating portion is the region where electrons and holes recombine.

The use of a pattern of reflective interfaces allows fine control over the number of optical modes present in the cavity, as the pattern of interfaces essentially acts like a Bragg reflector, producing a much larger reflectivity for light propagating in the plane of the layers.

The pattern may be a two dimensional pattern of interfaces provided in the plane of the layer or layers of the photon generating portion. Alternatively, a one dimensional pattern of interfaces can be used, the width of the cavity in the other lateral dimension within the plane being reduced to provide confinement in this dimension. For example, the cavity region can be formed as a narrow strip, with a one dimensional pattern of interfaces formed along the strip.

The pattern is a regular repeating pattern having a constant period. At the irregularity, there is a change in the period.

The photon generating portion is preferably located in an irregularity in the pattern. More preferably, the photon generating portion is located at the centre of such an irregularity. The photon generating portion is preferably located within the layer or plurality of layers of the cavity. However, the photon generation portion may be provided directly above or below the three dimensional cavity, such that when the device is viewed from a direction which is perpendicular to the plane of the layer or layers, the photon generating portion within the irregularity in the pattern.

The above three dimensional cavity should not be confused with a standard optical cavity. In the cavity of the above photon emitter, the photon modes are confined to a localised region about the generating portion such that the optical field is altered, restricting the number of optical modes. The three dimensional cavity can be thought of as analogous to a quantum box or dot for photons. In an electronic quantum dot the motion of a carrier is restricted to the general order of the de Broglie wavelength in all three dimensions. In the same manner as a quantum dot, the cavity is configured to confine the motion of the photon to the order of the photon wavelength.

The above description has concentrated on the formation of a pattern to provide lateral confinement in the plane of the layers. Confinement in the dimension perpendicular to the layers or layers can be achieved by a number of known methods. Typically, a semiconductor device will be fabricated using layer by layer growth technique such as MBE or MOCVD. Techniques for forming such a structure by this method are well known and it is possible to construct a cavity where light is spatially confined in one dimension by the growth of mirror regions above and below the photon generation portion. These mirror regions may be Bragg mirrors formed by an alternating stack of dielectric layers, metal mirrors or a combination of the two.

The Bragg mirrors can be formed by alternating layers such as GaAs/Alox, GaAs/AlAs, $TiO_2/SiO_2$, $Al_xGa_{1-x}As_ySb_{1-y}/AlAs_ySb_{1-y}$ (where y=0.5 and x=0.1), InP/InGaAsP, $InP/In_{0.52}Al_{0.48}As$, InP/InAlox. GaAs/Alox or InP/InAlox are particularly preferable because of the large refractive index contrast between Alox and GaAs or InP and InAlox. This means that fewer layer repeats are required to produce a high reflectivity mirror. Preferably, the alternating stack will comprise from 2 to 50 periods, more preferably from 2 to 20 periods.

The upper and lower mirror regions define a one dimensional cavity, the total thickness of the cavity region is chosen to be an integer number of $\lambda/2n$, where n is the average refractive index of the cavity.

As mentioned above, a metal layer can be used as the mirror region, such a layer can be made from Gold, Silver, Aluminium etc.

Where a metal mirror layer is used, it is preferable if a phase matching region is provided between the metal layer and the cavity in order for an antinode to be provided at the upper surface of the one dimensional cavity.

This one dimensional confinement causes the intensity of the confined optical mode to be strongest in the region between the two mirrors. The two mirrors strongly modify the angular dispersion of the emitted light such that light at the resonant wavelength is emitted into a narrow cone centred around the normal to the mirrors.

Preferably, the emitted radiation should be emitted through just one of the mirror regions. To achieve this, the two mirror regions should have different transparencies such that the radiation will be emitted through the mirror with the highest transparency. When the mirror regions are Bragg reflectors, the variation in transparency can be achieved if the upper and lower mirrors have differing numbers of periods. For example, if emission is required from the upper surface of the emitter, the upper mirror may have 3 periods, whereas the lower mirror has 5 periods. This is to concentrate the emission to occur from just one surface of the device.

The device may also be configured such that the light is emitted in the plane of the layer or layers. This can be achieved by reducing the number of repeats of the pattern in the direction in the plane along which light emission is required. The device can be cleaved to provide an output face normal to the described emission direction. Alternatively, a second irregularity can be introduced into the pattern to guide the light away from the first irregularity.

The two dimensional pattern of reflecting interfaces serves to concentrate the optical modes in the cavity about a point in the plane of the layer or layers. The generation portion is arranged within an irregularity in the pattern. Thus, the emitted radiation is emitted in a narrow cone centred about the normal to the first and second confinement means and about the irregularity in the pattern. The narrow emitted cone of radiation can then be collected by an optical fibre or the like.

A two dimensional pattern of interfaces may take a number of forms. For example, the pattern may be provided on a triangular, rectangular or hexagonal lattice.

Preferably, the pattern is formed by patterning the one dimensional cavity. For example, the reflecting interfaces may be provided by an pattern of holes located in said one dimensional cavity. The holes may be empty or filled with a suitable dielectric material.

Alternatively, the interfaces surfaces could be provided by a plurality of columns formed in the one dimensional cavity. The cross-section of the holes or columns are preferably circular. However, rectangular cross-sections or other shapes could also be used. The pattern could also be a series of concentric rings, the 3D cavity being formed at the centre. The period measured along a radius being constant except at the centre.

In a preferred configuration, the holes extend through at least one of the mirror regions. Preferably it extends through both of the mirror regions.

Generally, it is desirable to generate light with a wavelength of either 1.3 µm or 1.55 µm as both of these wavelengths are commonly used for fibre optic cables. For a triangular lattice, the hole separation would be in the range 200-2000 nm and the size of the holes would be chosen to remove 20-80% of the surface area. The structure can also be designed to operate at other wavelengths.

The photon generation portion is preferably provided at an antinode of the cavity photon field. The generating means will preferably comprise a quantum dot.

Such a quantum dot can be configured to emit photons in response to irradiation by a pulsed laser beam. For example, the type of emitter discussed in copending UK application number 9927690.9. Therefore, preferably, the generator comprises a quantum dot having a first confined energy level capable of being populated with an electron and a second confined energy level capable of being populated with a hole; and supply means for supplying carriers to the said energy levels, wherein the supply means are configured to supply a predetermined number of carriers to at least one of the energy levels to allow recombination of a predetermined number of carriers in said quantum dot to emit at least one photon.

Carriers may be supplied to at least one of the said energy levels by irradiating the dot with pulsed incident radiation.

Preferably, the pulse of the incident radiation has a duration which is less than the relaxation time of a carrier which is excited in the quantum dot. More preferably, the time between the leading edges of successive pulses is greater than the recombination time of an electron and hole in the quantum dot.

Although the present invention is primarily concerned with single photon sources, it will be appreciated by these skilled in the art that the ability to efficiently direct photons generated by any type of optical source is of use. Thus the device can be used as a high efficiency light emitting diode or laser.

In a third aspect, the present invention provides a method of forming an optical device comprising the steps of:
　forming a first mirror region;
　forming a cavity region having a quantum dot by:
　　forming a lower cavity region overlying said first mirror region;
　　forming a quantum dot overlying said lower cavity region;
　　forming an upper cavity region overlying said lower cavity region to encapsulate said quantum dot;
　patterning the cavity region to form a plurality of reflecting interfaces, a three dimensional cavity being formed at an irregularity in the pattern, wherein the three dimensional cavity is configured to confine a photon to a length scale of the order of the photon wavelength such that the photon can only occupy a discrete number of optical modes in three dimensions.

The method preferably further comprises the step of forming a second mirror region overlying the upper cavity region.

Preferably, at least one of the first or second mirror regions is formed using alternating layers wherein one of the alternating layers is AlAs or InAlAs, the method further comprising the step of oxidising the AlAs or InAlAs layer to form Alox.

Preferably, the pattern of reflecting surfaces is provided by etching holes through said cavity region. More preferably, the etch extends through said first mirror region.

The second mirror region may also be patterned. However, it is also possible to perform the step of patterning and etching the cavity prior to the formation of the second mirror region such that the second region is not patterned.

Therefore, in a fourth aspect, the present invention provides a method of forming a photon emitter comprising the steps of:
　forming a first mirror region;
　forming a cavity region having a quantum dot by:
　　forming a lower cavity region overlying said first mirror region;
　　forming a quantum dot overlying said lower cavity region;
　　forming an upper cavity region overlying said lower cavity region to encapsulate said quantum dot;
　patterning the cavity region to form a plurality of reflecting interfaces
　forming a second mirror region overlying the patterned cavity region, wherein the first mirror region, second mirror region and pattern of interfaces are configured to define a three dimensional cavity at an irregularity in the pattern, wherein the three dimensional cavity is configured to confine a photon to a length scale of the order of the photon wavelength such that the photon can only occupy a discrete number of optical modes in three dimensions.

A quantum dot is provided for recombination of electrons and holes. Such a quantum dot is preferably formed using the Stranski-Krastanow growth technique, where dots are formed by growing a few monolayers of a first layer overlying a second layer, wherein the lattice constant of the first and second layers is different such that the second layer is strained. Preferably, 0.6 to 4 monolayers are grown. The first layer is preferably grown from are chosen from InAs, InSb, GaSb, InGaAs, InGaAsNi, GaP, InP, InGaP, InGaSb or alloys thereof which provide a mismatched lattice constant i.e. lattice mismatched from the substrate or second layer. The second layer is preferably chosen from GaAs, AlGaAs, AlAs. The substrate can be GaAs or InP. InP is a particularly preferred substrate especially when InAs is used as the dot material as emission at 1.55 µm can be obtained.

The above discussion has related to the formation of a photon emitter. However, in a fourth aspect, the present invention provides an optical device comprising: a quantum dot located in a three dimensional optical cavity configured to confine a photon to the order of the photon wavelength in all three dimensions, the quantum dot and optical cavity being configured such that there is strong coupling between the confined electronic modes of the quantum dot and the optical modes of the cavity, wherein the three dimensional optical cavity is provided within a layer or a plurality of layers and optical confinement in one of the dimensions within the plane of the layer or layers is provided by a pattern of reflective interfaces, the three dimensional optical cavity being formed at an irregularity within the pattern.

For strong coupling, the three dimensional cavity is designed to be resonant with a quantum dot transition energy i.e. the energy of the allowed cavity mode $E_{cav}=hc/\lambda$ that of a quantum dot transition. The quantum dot transition energy and the optical mode hybridise to form two coupled states. The energy splitting of these coupled states is called the Rabi splitting $2\Omega$, this is a measure of the coupling strength. For strong coupling the Rabi splitting is measurable, in other words, it is possible to optically resolve the difference in the splitting of the two hybridised modes.

When there is strong coupling, the device will reflect incident radiation which is not at either of the two energies $E_{cav}+\Omega$ and $E_{cav}-\Omega$. When the device is irradiated with radiation having either of these energies, a photon is absorbed which excites an electron hole within the quantum dot. This blocks the absorption of further photons. When the oscillator strength of the quantum dot is blocked in this way, the coupling of the quantum dot in the cavity mode turns off such that the device will now reflect radiation at all wavelengths other than of the cavity mode.

In other words, by populating and depopulating the quantum dot, transmission of a beam impinging on the device, having at the cavity energy, can be switched on and off as required.

In a sixth aspect, the present invention provides a method of operating an optical device, the optical device comprising: a quantum dot located in a three dimensional optical cavity which is configured to confine a photon to the order of the photon wavelength in all three dimensions, the quantum dot and optical cavity being configured such that there is strong coupling between the confined electronic modes of the quantum dot and the optical modes of the cavity, wherein the three dimensional optical cavity is provided within a layer or a plurality of layers and optical confinement in one of the dimensions within the plane of the layer or layers is provided by a pattern of reflective interfaces, the three dimensional optical cavity being formed at an irregularity within the pattern, the method comprising the steps of: irradiating the device with a main beam of radiation having an energy which is substantially equal to that of the cavity mode in the absence of the quantum dot, and selectively illuminating the device with a control beam comprising at least one photon having an energy which is equal to one of the coupled modes between the three dimensional cavity and the dot, in order to control whether the main beam is reflected or transmitted.

The above device can be used as an optical switch or transistor. It can also be used in an optical reading device in a fibre optic network.

The device in accordance with a fifth aspect of the present invention can be fabricated in accordance with the above described fabrication methods.

The preferred material systems and design considerations are the same as those described with reference to the photon emitter of the first to third aspects of the present invention.

The present invention will now be described with reference to the following non-limiting embodiments:

BRIEF DESCRIPTION OF THE DRAWINGS

FIG. 8 shows a schematic band structure of a quantum dot for generating single photons in accordance with an embodiment of the present invention;

FIG. 9 shows a fabrication stage of a device in accordance with an embodiment of the present invention;

DETAILED DESCRIPTION OF THE PREFERRED EMBODIMENTS

Figure 1:
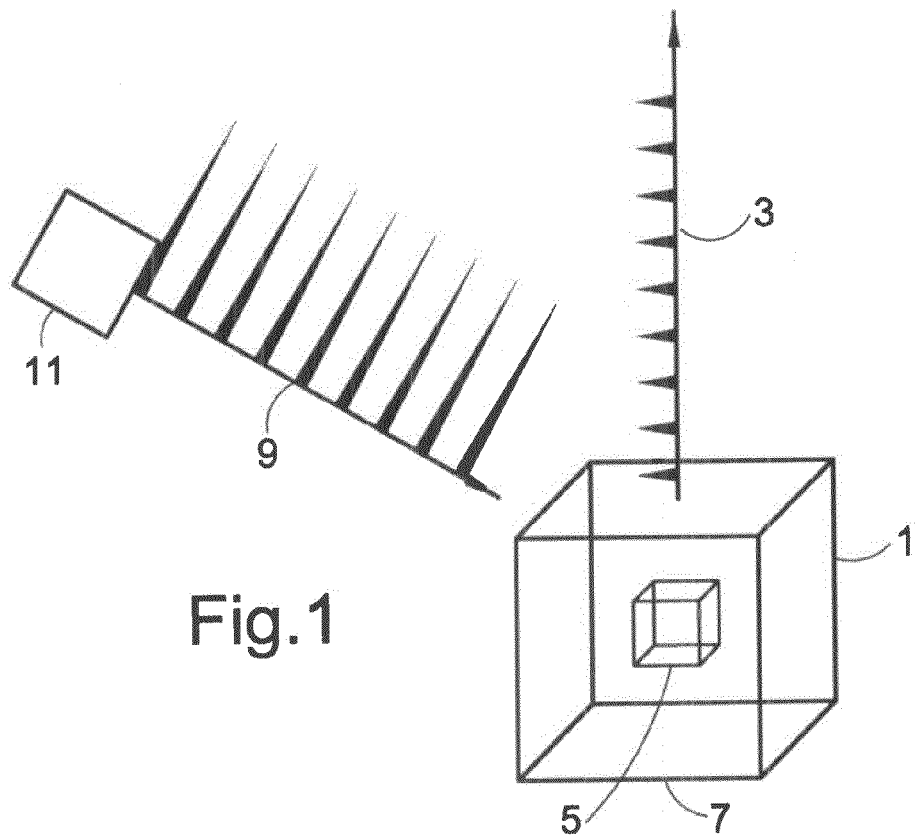
FIG. 1 shows a schematic of a photon emitter in accordance with an embodiment of the present invention.

FIG. 1 shows a schematic of a single-photon emitter 1 directing its output in a predetermined direction 3. The optical source comprises a quantum dot 5 which is located within a three-dimensional mirror cavity 7.

The quantum dot 5 is configured to emit a stream of regularly spaced single photons or emit pulses of multiple photons in response to irradiation by pulsed beam 9 from pulsed laser diode 11. An example of how this is achieved will be described with reference to FIG. 6. In the absence of an optical cavity, the quantum dot 5 will irradiate isotropically. Therefore, only a small amount of the radiation will be emitted in direction 3. However, use of the three dimensional mirror cavity 7 allows the radiation emitted by quantum dot 5 to be directed in predetermined direction 3. This radiation can be efficiently collected by a fibre optic cable, or the optic.

Figure 2:
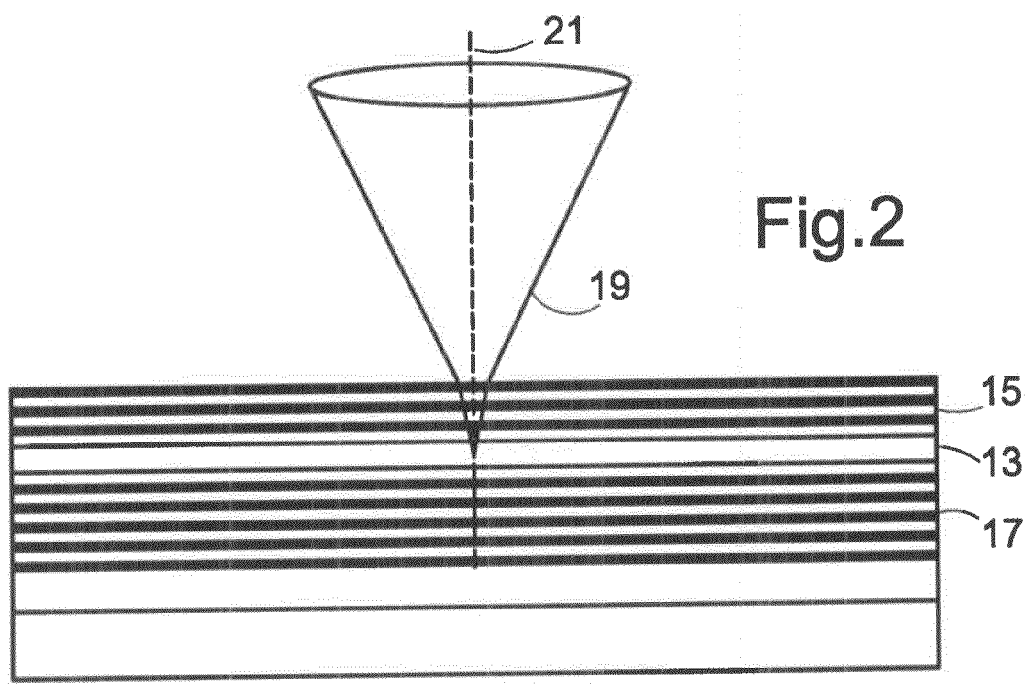
FIG. 2 shows a schematic of a one dimensional cavity.

FIG. 2 shows a one-dimensional cavity. The cavity 13 is defined by an upper Bragg mirror 15 and a lower Bragg mirror 17. The upper 15 and lower 17 Bragg mirrors each comprise a stack of alternating layers. The alternating layers have different dielectric constants. The two mirrors will reflect light over a particular band of wavelengths.

The intensity of the confined optical modes is strongest in the cavity 13 between the upper and lower Bragg mirrors 15, 17. The upper and lower Bragg mirrors 15, 17 strongly modify the angle of dispersion of the emitted light. As a result, the light of the resonant wavelength of the cavity is emitted into a narrow cone 19 centred about the normal 21 to the two mirrors. However, in the situation of FIG. 2, the optical modes are not restricted in the lateral directions. Thus, much of the light can also be emitted along the plane of the cavity layer.

In FIG. 2, the lower Bragg mirror 17 is thicker than the upper Bragg mirror 15. Thus, light will be emitted through upon Bragg mirror 15 as it has a higher transmittance than lower Bragg mirror 17.

Although this channels the light into the fibre optic cable 3, it is still advantageous to reduce the fraction of the light emitted in the plane of the cavity layer.

Figure 3:
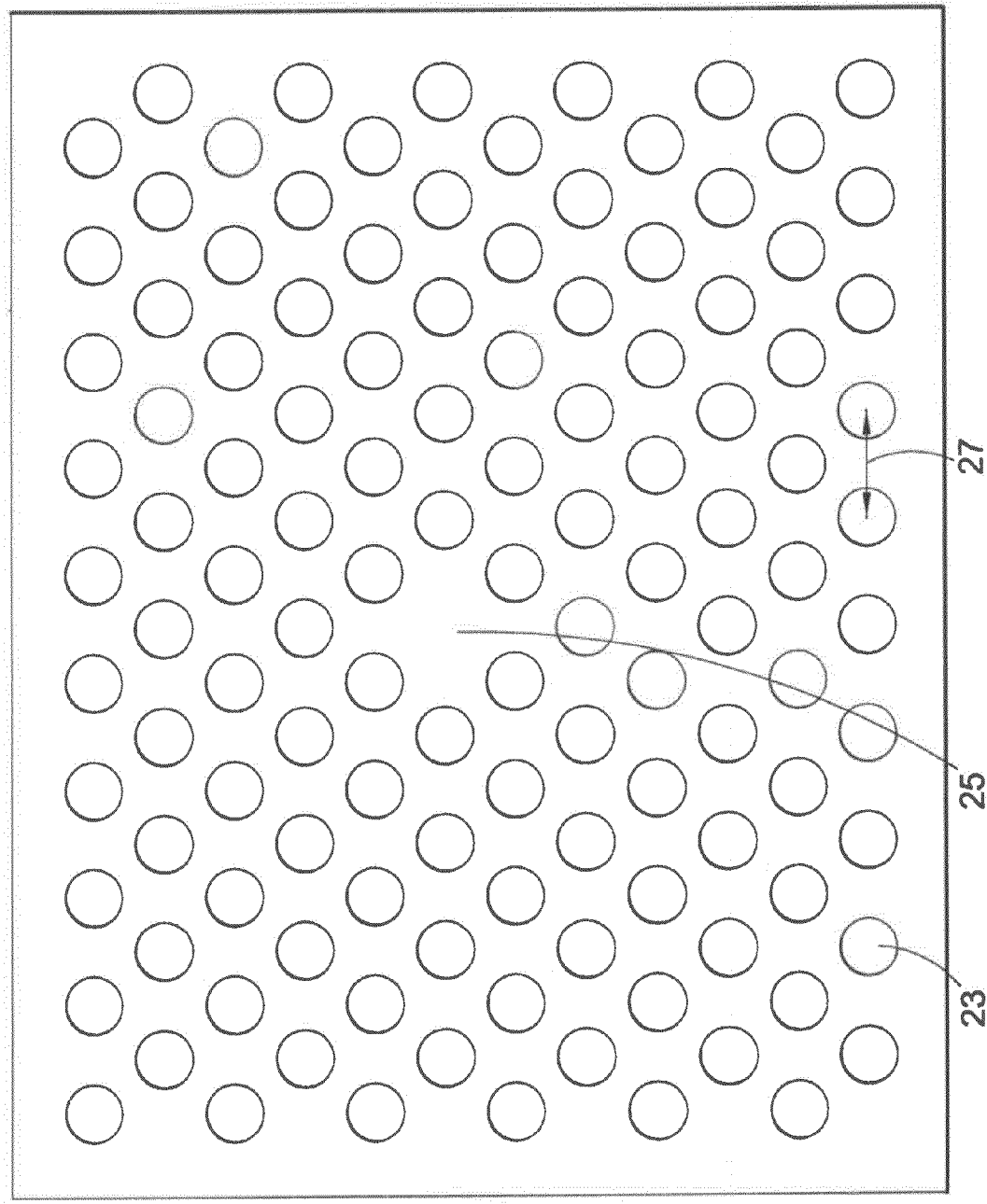
FIG. 3 shows a schematic of a two dimensional pattern of reflecting surfaces which can be used in a device according to an embodiment of the present invention.

Further confinement of the output from quantum dot 5 can be achieved by patterning the 1D cavity of FIG. 2 as shown in FIG. 3. A two dimensional pattern of reflecting surfaces are provided in order to confine the optical modes around the quantum dot.

Figure 4:
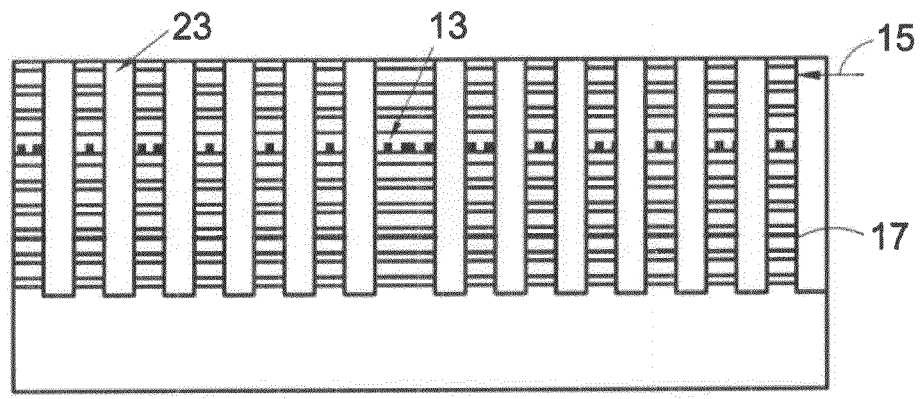
FIG. 4 shows an optical source in accordance with an embodiment of the present invention.

The structure of FIG. 2 is etched to provide an pattern of etched holes 23. The etched holes are generally circular. A cross-section of this structure is shown in FIG. 4. To avoid unnecessary repetition, the same reference numerals have been retained.

The reflecting surfaces formed around the holes of the pattern suppresses the optical modes propagating in the plane of the cavity layer 13. These holes 23 can be filled with a dielectric material or left empty. They act as Bragg mirrors and reflect light propagating in the plane of the cavity layer.

The quantum dot 5 is arranged inside an irregularity 25 in the pattern where the separation of the hole centres 27 is largest. The light field is strongest inside this defect 25 in the pattern.

Figure 5:
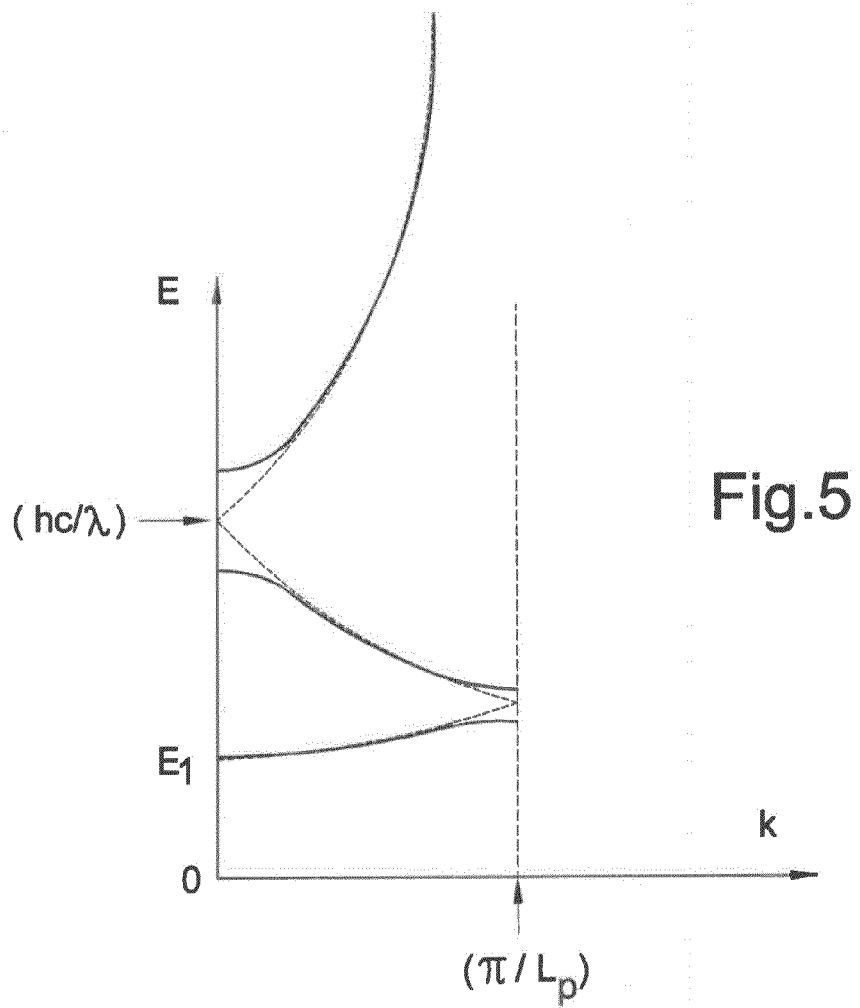
FIG. 5 shows a plot of energy against wave vector for electrons in accordance with an embodiment of the present invention.

FIG. 5 is a schematic diagram of the dispersion of the optical modes in the patterned cavity without the introduced defect. The lateral patterning of the device is configured to suppress the optical modes propagating in the cavity at the operating wavelength $\lambda$.

Thus, the pattern is arranged so as to produce a bandgap in the dispersion at the operating wavelength. The following discussion is useful for understanding how the pattern suppressed modes of wavelength $\lambda$ propagating in the plane of the cavity. The applicant does not in any way wish to be bound by this theory. The energy (E) of the photon modes in the absence of any lateral patterning is.

$$E=[(E_m)^2+(hck/2\pi n_c)^2]^{0.5}$$

Where $n_c$ is the average refractive index of the cavity seen by the mode, of thickness $L_c$ and k is the k-vector of the mode in the plane of the cavity layer. $E_m=(m\,h\,c/n_c\,L_c)$ is the energy due to confinement of the $m^{th}$ cavity at k=0, where m is an integer.

If the cavity is patterned with a period $L_p$, the translational symmetry of the device is reduced and the dispersion can now be described by a reduced Brillouin zone with a boundary at $(\pi/L_p)$. This is believed to have the effect of "folding back" the mode dispersion, thereby creating additional modes at k=0.

Bandgaps open in the dispersion at high symmetry points, including k=0. The device is designed so that operational wavelength of the device coincides with one of these bandgaps, as shown in FIG. 5.

In FIG. 5, the theoretical dispersion curve with band gaps at the high symmetry points is shown as a solid line. The dotted line is intended as an aid for the eye to show how the dispersion curve for the non-patterned case is folded back in the patterned case.

The irregularity in the periodic structure produces a defect (or resonant) state in the bandgap. The energy of the resonant state is chosen to coincide with the emission photon energy of the quantum dot.

If the operational wavelength is chosen to coincide with the first folded back mode of the first confined mode, then the period of the pattern is approximately given by:

$$\frac{n_c^2}{\lambda^2} = \frac{1}{L_c^2} + \frac{1}{L_p^2}$$

Assuming that the holes occupy 50% of the cavity, the average refractive index can be approximated to $n_c$=1.8, for $\lambda$=1.3 µm and $L_c$=1 µm, $L_p$=1.043 µm and the holes arranged on a triangular lattice should have a radius of 387 nm.

Figure 6:
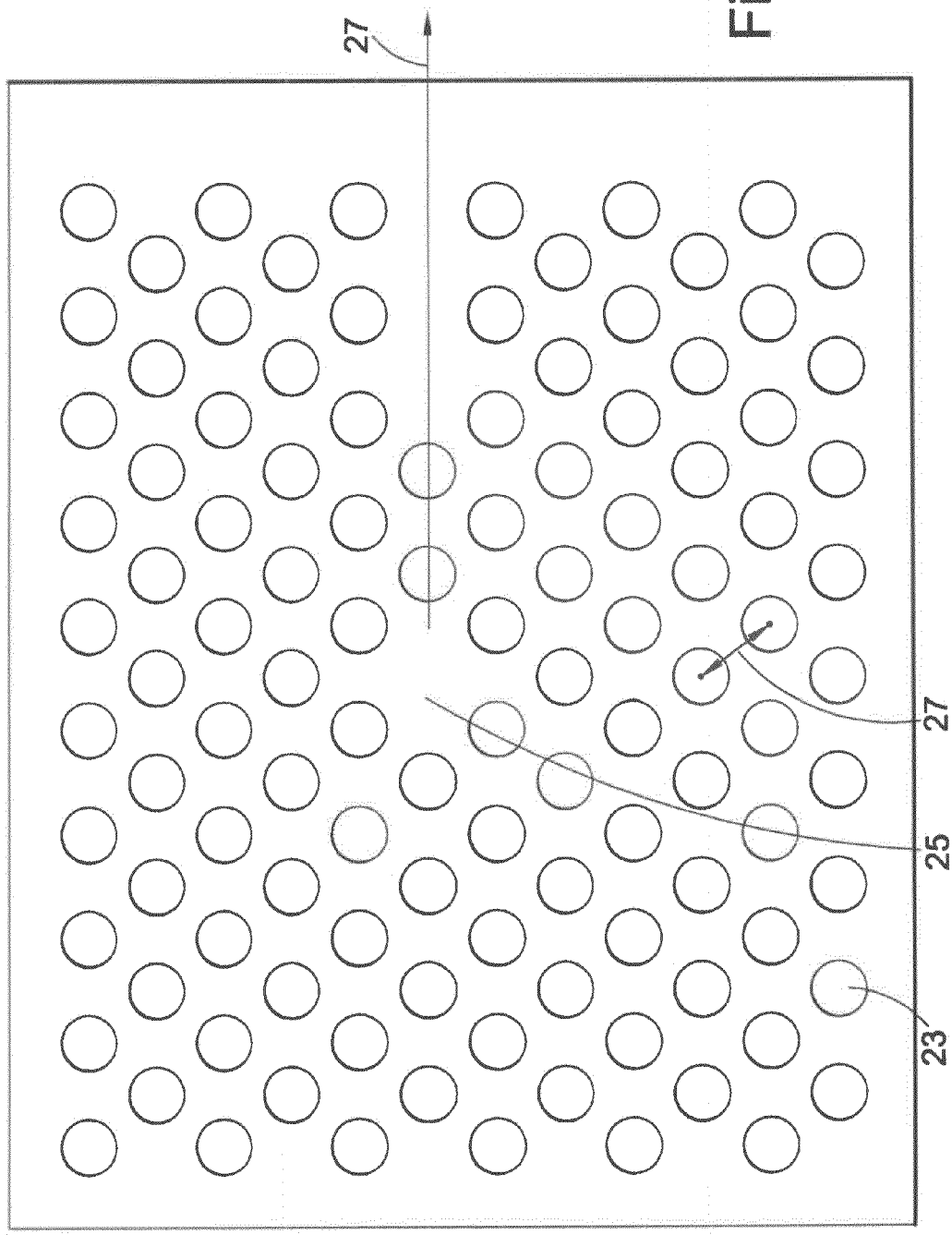
FIG. 6 shows a schematic of a two dimensional pattern of reflecting surfaces which is configured to emit light in a preferential direction within the plane of the 2D patterning.

In the device shown in FIGS. 3 and 4, light is emitted through the upper Bragg mirror 50 because the upper Bragg mirror has a higher transmittance than that of the lower Bragg mirror. However, it is not only possible to direct the light so that it is emitted through one or the other of the Bragg mirrors 15 and 16. In the device of FIG. 6, light is emitted in a predetermined direction which is within the plane of the cavity layer. The layer structure of the device of FIG. 6 will be essentially the same as that described with reference to FIGS. 2 and 4. However, the upper and lower Bragg mirrors have the same thickness. Looking at the plane view of FIG. 6, a two dimensional pattern of reflecting interfaces is formed by etching holes 23. The holes are formed on a regular lattice so that they have constant spacing 27. The photon generating portion is formed at an irregularity 25 in the pattern. The pattern of holes formed around photon generation portion 25 is regular in two dimensions except for preferred emission direction 26. Here, a number of the holes have not been formed. This irregularity in the pattern about the central point causes light emitted from the photon generation portion to be emitted along direction 26.

Figure 7:
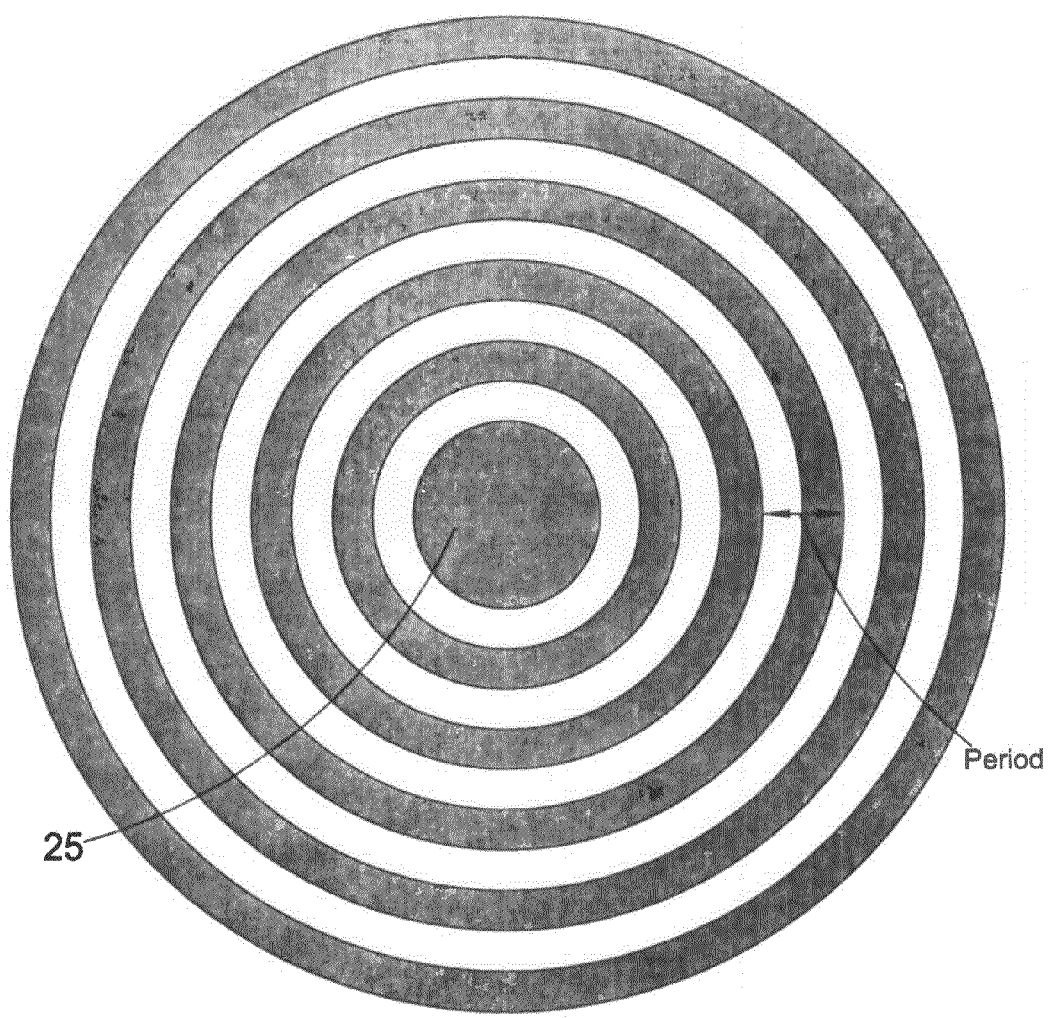
FIG. 7 shows a schematic of another two dimensional pattern which can be used in a device according to an embodiment of the present invention.

FIG. 7 shows a plan view of a device where the cavity has been patterned with a plurality of concentric circles formed about photon generation portion 25. The period of the pattern taken along any radius about the centre is constant. Thus, the radial thickness of each hole is a constant and the radial thickness of each circular wall is also a constant. The periodicity of the structure breaks down at its centre and the photon generation portion is formed in this irregularity.

FIG. 8 shows a simplified band-structure for a quantum dot. One way in which the quantum dot can emit photons will be described with reference to this figure. The single quantum dot 31 forms a minimum in the conduction band 33 and a maximum in the valence band 35. A plurality of quantised conduction band levels 37 are formed in the conduction band minima 39 and a plurality of quantised valence band levels 41 are formed in the valence band maxima 43.

When one of the plurality of conduction band levels 37 is populated by electron 45 and one of the plurality of valence band levels is populated by hole 47, the electron and hole recombine. Recombination of the single electron and a single hole results in the emission of a single photon.

The recombination of an electron and hole does not incur the instant that an electron and a hole populate the confined energy levels 37, 41 respectively. Instead, there is, on average, a finite delay between the population of the two levels and the emission of a photon. This is known as the "recombination time". In a beam of conventional laser light, there are many photons. It is impossible using attenuation of a laser beam alone to obtain a regular stream of photons. However, in the quantum dot shown in FIG. 8, a photon is emitted only when an electron and hole recombine. Therefore, providing that electrons and holes can be supplied to the dot one by one at regular time intervals and that the recombination time is shorter than the time between population of both confined energy level 37, 41, a stream of single photons can be produced.

The above described situation where an electron is excited into the conduction band and then recombines with a hole is an oversimplification of the process. The electron can occupy any of the plurality of levels 37 in the conduction band minima 39. Similarly, the hole can occupy any one of the plurality of valence band levels. If the electron and hole in the quantum dot are excited optically, then the energy level occupied by the electron and hole initially, is dependent on the wavelength (or energy) of the incident light.

The electron 45 may be excited into the ground state conduction band level 38 from which it will decay to recombine with a hole, or it may be excited into an excited conduction band level 40. From an excited level 40 (such as the ground state conduction band level (38)), the electron will most probably relax into a lower energy level in the conduction band before recombination. The time which a carrier takes to transfer from an excited level to a lower level is known as the "relaxation time". Generally, it is more statistically favourable if the carrier decays from an excited state to the ground state conduction band before recombination.

Hole 47 can also be excited into the ground valence band level 42. From here, it will recombine with an electron. Also, the hole may be excited into excited valence band level 44. From here, it can relax into a lower valence band level such as the ground level 42 prior to recombination.

Considering the dot of FIG. 8 as the single photon emitter of FIG. 1, the electron 45 and hole 47 are excited into the confined energy levels 40, 44 respectively by excitation of the quantum dot 5 by pulsed laser diode 11. A first pulse arrives at the quantum dot 31 and excites an electron hole pair 45, 47. Once an electron hole pair is excited, no further radiation can be absorbed by the dot. The pulse duration should be shorter than the relaxation time of the carriers. If the pulse duration is longer than the relaxation time then a carrier which had been excited into an excited conduction band level might relax during illumination of the dot. This would mean that a second electron/hole pair could be excited in a single pulse of radiation. The time between the leading edge of subsequent pulses should be longer than the recombination time so as to allow excitation of an electron-hole pair by the next pulse. Therefore, the electron and hole pair should recombine before the next pulse arrives. By using this technique, it is possible to produce a stream of single photons.

The laser pulse 9 can be passed through a polarisation filter to select the required polarisation, be it one of the orthogonal components of left or right circularly polarised.

The polarised beam is then focused onto the single photon source 11. The output from single photon source 11 is then directed in predetermined direction 3. The emitted radiation may be fed through polarisation splitter (not shown) which is capable of separating the two orthogonally polarised components of the emitted photon beam.

Figure 10:
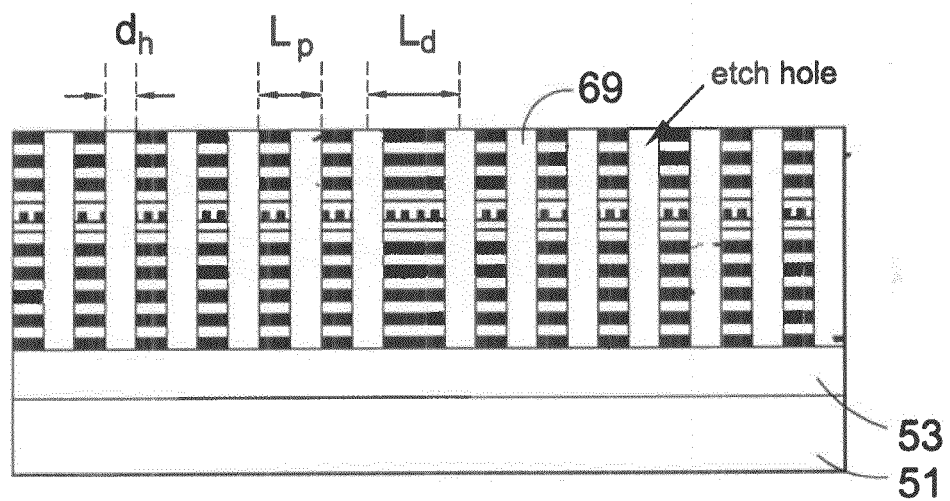
FIG. 10 shows a further fabrication stage of the device of FIG. 9.
Figure 11:
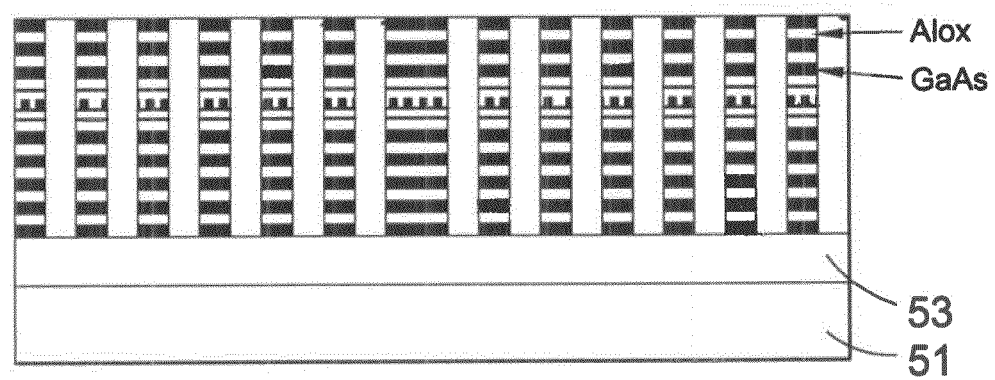
FIG. 11 shows a yet further fabrication stage of the device of FIG. 9.

FIGS. 9 to 11 show processing stages of a device in accordance with an embodiment of the present invention.

A buffer layer 53 of GaAs is formed overlying and in contact with a GaAs substrate 51. The buffer layer 53 is formed using an epitaxially growth technique such as molecular beam epitaxial (MBE) or metal organic vapour phase epitaxial (MOVPE). A lower Bragg mirror 55 is formed overlying and in contact with buffer layer 53. The lower Bragg mirror is formed from alternating layers of GaAs 57 and AlAs 59.

A GaAs lower cavity layer 61 is then formed overlying and in contact with the upper surface of said lower Bragg mirror 61. A layer of quantum dots 63 is then formed by depositing InAs overlying and in contact with the lower cavity layer 61. A GaAs upper cavity layer 65 is then formed overlying and in contact with said quantum dot layer 63. The lower cavity layer 61 and the upper cavity layer 65 together form the cavity region. The quantum dot layer 63 is provided between the two cavity layers 61 and 65.

An upper Bragg mirror 67 comprising alternating layers of GaAs and AlAs is then formed overlying and in contact with said upper cavity layer 65. A GaAs capped layer (not shown) may be formed on the upper Bragg mirror 67.

The thickness of the GaAs and AlAs layers are chosen so that after patterning they form a Bragg mirror around the photon wavelength $\lambda$ of interest. The wavelengths which are of particular interest are $\lambda=1.3$ μm and $\lambda=1.55$ μm. Both these wavelengths are used in fibre optic cables. At $\lambda=1.3$ μm, the layer thicknesses are 92.9 nm (GaAs) and 207.7 nm (AlAs). For operation at 1.55 μm, these thicknesses can be increased to 110.7 nm (GaAs) and 250 nm (AlAs). It should be noted that these values are only approximate because the layer thicknesses will depend upon the processing step which will be described with reference to FIG. 10.

The upper and lower Bragg mirrors 55, 67 have typically between 2 and 20 periods. In this example, the upper Bragg mirror 67 will be closest to the fibre, this mirror has 3 periods whereas the lower mirror 55 has 5 periods. The difference in the number of periods between the upper and lower Bragg mirrors 55, 67 means that the radiation is likely to be emitted through the upper Bragg mirror 67.

The cavity region 60 of FIG. 7 is a one dimensional cavity. The lower 55 and upper 67 Bragg mirrors serve to confine the optical mode in one dimension only. The upper and lower cavity layers 61, 65 are made from GaAs. For a GaAs cavity layer with 50% air holes by area operating at 1.3 μm, the thickness should be greater than 742.8 nm, while for 1.55 μm, the thickness should be greater than 885.6 nm. For instance, the cavity layer could have a thickness of 1000 nm.

The quantum dot layer 63 is formed using a self-assembling technique. In the current example, it is formed by depositing a thin layer of InAs having a thickness of between 1.6 and 4 monolayers at a substrate temperature of less than 530° C. This thin, highly strained layer, self assembles into islands on the growth surface of the lower cavity layer 61. Overgrowth of these islands by the upper cavity layer 65, allows the formation on encapsulated quantum dots within the cavity region 60. The quantum dot is placed at the antinode of the photon field so as to maximise its coupling with the light field.

The device is now etched to form a two dimensional pattern of reflecting surfaces similar to those shown in any of FIG. 3, 6 or 7.

In this particular example, a pattern generally similar to that described with reference to FIG. 3 is formed. The holes are cylindrical and are arranged in a lattice which may be triangular, rectangular or hexagonal in symmetry. The etch shown here extends through the upper Bragg mirror 67, the cavity region 60 and the lower Bragg mirror 65. The radius of the holes $d_h$ as well as their separation $L_p$ is determined so as to suppress the photonic modes at the operational wavelength. In this example, the holes are on a triangular lattice and have a radius of approximately 387 nm and an average separation of 1043 nm. The active area of the device i.e. the area where the light is emitted is located where the separation of the holes is larger than in other areas $L_d$. The photon field is localised around this area. In this example, the separation of the holes in the centre is 2086 nm, thus forming the irregularity.

The holes can be etched using any of the standard methods such as reactive ion etching or chemical etching. The pattern where the holes are to be etched can be defined also using any standard techniques. For example, a layer of photoresist may be deposited on the upper surface of the upper Bragg mirror 67. Either a positive or negative photoresist can be used. The pattern may be defined using standard photolithographic techniques or the pattern may be drawn using an electron beam.

Once the holes have been etched, the AlAs layers in lower and upper Bragg mirrors 55 and 67 are oxidised to form Alox. This step is shown in FIG. 11. The step is achieved by flowing $N_2$, which has been bubbled through water at 90° C., over the device. The device is at a temperature of 425° C. in a suitable furnace. The device is then left in a furnace long enough to oxidise all of the AlAs.

In an alternative example, the AlAs layers may be oxidised prior to etching.

Figure 12:
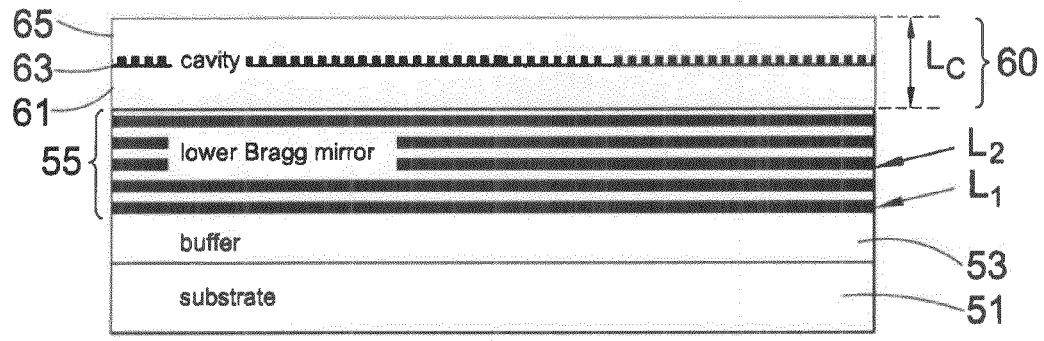
FIG. 12 shows a fabrication stage of a device in accordance with an embodiment of the present invention.

FIG. 12 shows a further example of the photon source in accordance with an embodiment of the present invention. To avoid unnecessary repetition, like reference numerals denote like features.

A lower Bragg mirror 55 is formed overlying and in contact with the upper surface of buffer layer 53. As for FIG. 9, the lower Bragg mirror is formed of alternating layers of GaAs and AlAs. The thickness of the layer is chosen so as to form a mirror at the operational wavelength of the device. For example, when $\lambda=1.3$ μm and the refractive indices of GaAs and AlAs are 3.405 and 2.927 respectively, layer thicknesses of 95.9 nm and 110.0 nm are used respectively. Lower Bragg mirror 55 will consist of approximately 20 periods.

A lower GaAs cavity layer 61 is formed overlying and in contact with the lower Bragg mirror 55. A layer of InAs consisting of between 1.6 to 4 monolayers is provided on an upper surface of said lower cavity layer 61. Due to the large difference in lattice constant between the dot layer 63 and the lower cavity layer 61, the InAs arranged itself into self-organised dots. An upper cavity layer 65 is then provided overlying and in contact with said quantum dot layer 63. The layers 61 and 65 define the cavity 60, the dot layer 63 is located within the cavity.

Figure 13:
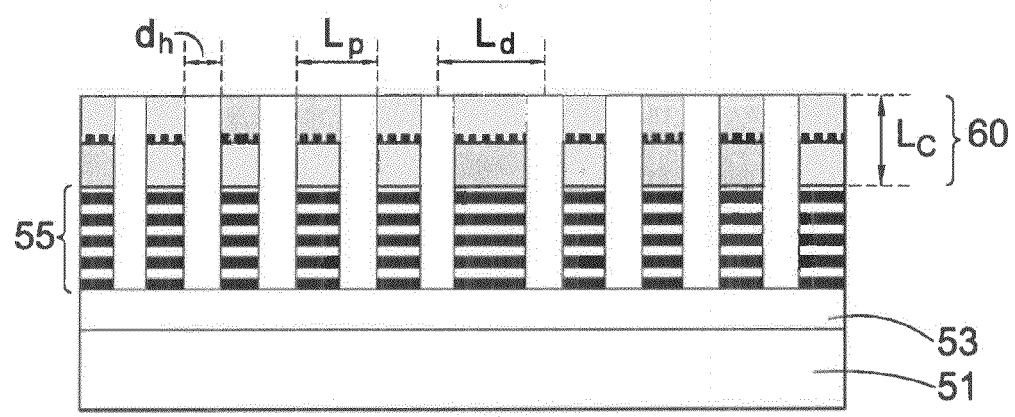
FIG. 13 shows a further fabrication stage of the device of FIG. 12.
Figure 14:
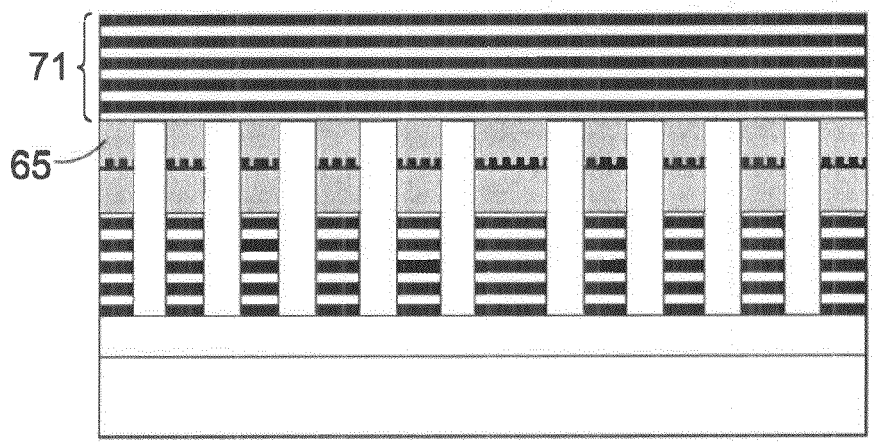
FIG. 14 shows a yet further fabrication stage of the device of FIG. 12.

The thickness of the cavity in this example is 1000 nm. The quantum dot layer 63 is provided at antinode of the cavity light field. The structure is then etched through the cavity layer 60 and through the lower Bragg mirror 55 as shown in FIG. 13. As explained with reference to FIG. 10, the etch holes can be approximately cylindrical and can be arranged in a lattice which is triangular, rectangular or hexagonal in symmetry. In this specific example, the holes are on a triangular lattice with a radius of 387 nm and an average separation of 1043 nm.

The active area of the device is formed in a irregularity in the hole pattern, the separation of the holes at the irregularity is 2086 nm. The pattern can be formed in any of the ways described with reference to FIGS. 10 and 11.

The upper Bragg mirror 71 is then formed overlying and in contact with the etched upper cavity layer 65. The upper Bragg layer in this example, comprises alternate layers of $SiO_2$ and $TiO_2$. The dielectric layers should have a low absorption at the operation wavelength. For $\lambda=1.3$ μm, the thickness of the $SiO_2$ and $TiO_2$ layers are approximately 221 nm and 138 nm respectively, while for $\lambda=1.55$ μm, they should be 264 nm and 164 nm respectively.

Figure 15:
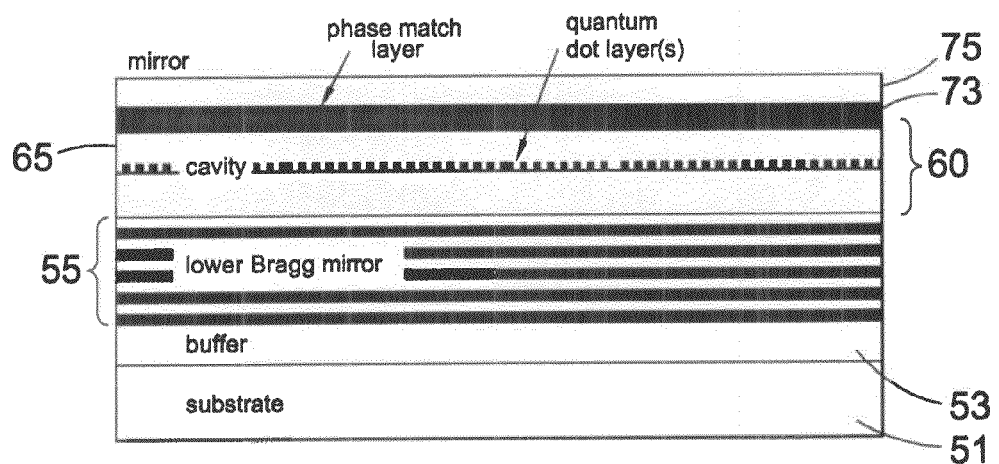
FIG. 15 shows a further example of a fabrication stage of a device in accordance with an embodiment of the present invention.

FIG. 15 shows a further variation on the device. The formation of the buffer layer, lower Bragg layer and cavity region is identical to that described with reference to FIG. 12. Therefore, to avoid unnecessary repetition, like reference numerals have been used to denote like features.

A phase matching layer 73 is then formed overlying and in contact with the upper cavity layer 65. A metal mirror layer 75 is then formed overlying and in contact with the phase matching layer 73.

The phase matching layer 73 is included to compensate for penetration of the photon field into metal layer 75. The thickness of the phase matching layer is chosen so there is an antinode in the photon field at the upper surface of the upper cavity layer 65. In this particular example, for a wavelength of $\lambda=1.3$ μm, and where the lower and upper cavity layers are GaAs, the phase matching layers should have a thickness of 70 nm.

The metal mirror layer 75 has a thickness of approximately 100 nm. It should be thick enough to ensure that the metal is highly reflective. To aid adhesion of the metal mirror layer 75 to the phase matching layer 73, a thin 5 nm NiCr layer is deposited on the upper surface 73 of the GaAs phase matching layer.

Figure 16:
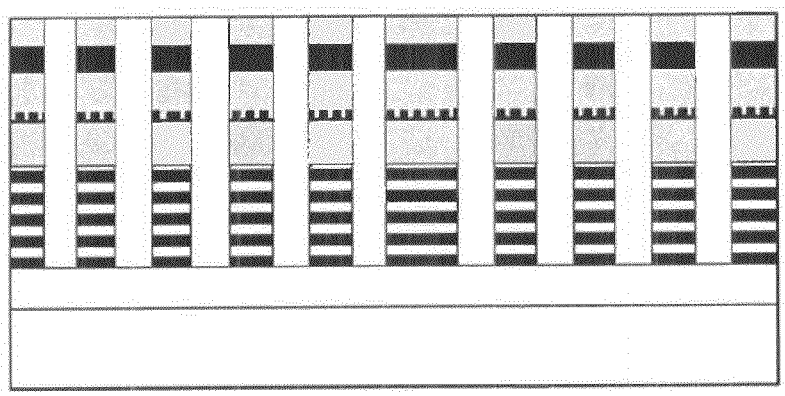
FIG. 16 shows a further fabrication stage of the device of FIG. 15.

A pattern of holes as described with reference to both FIGS. 10 and 13 are formed through the upper mirror, right through the structure down through the lower Bragg mirror 55 as shown in FIG. 16. Similar processing techniques as previously described could be used. The holes in this example could be on a triangular lattice and have a radius of 371 nm and have an average separation of 1043 nm. The separation of holes at the irregularity could be 2086 nm.

In this particular example, the metal layer can be etched first using a technique such as reactive ion etching. This etched layer 75 then acts as a template for etching the underlying semiconductor layers 55 and 60.

Figure 17:
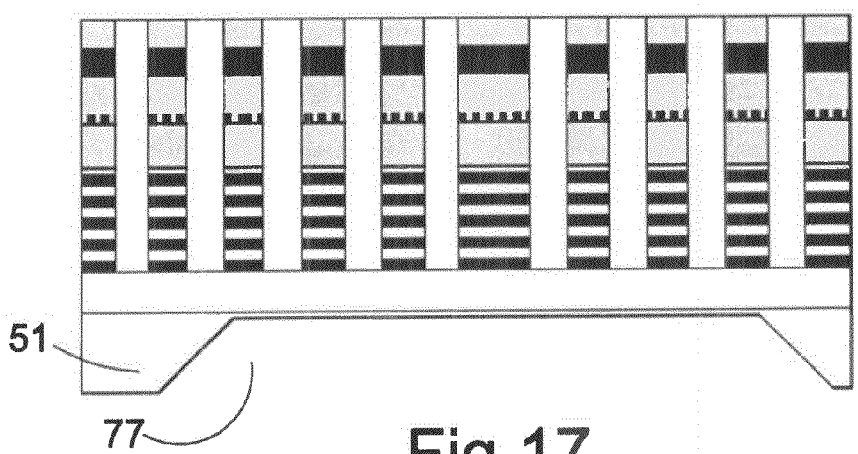
FIG. 17 shows a yet further fabrication stage of the device of FIG. 15.

In FIG. 17, a substrate 51 is further etched in order to form a window 77 which can receive a fibre optic cable. It will be appreciated that this window could also be formed at the top of the device.

Figure 18:
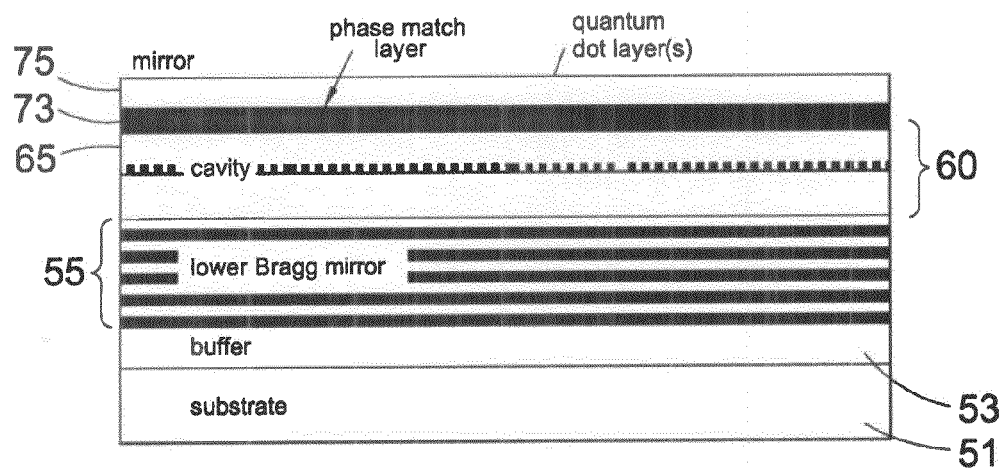
FIG. 18 shows a further example of a fabrication stage of a device in accordance with an embodiment of the present invention.
Figure 19:
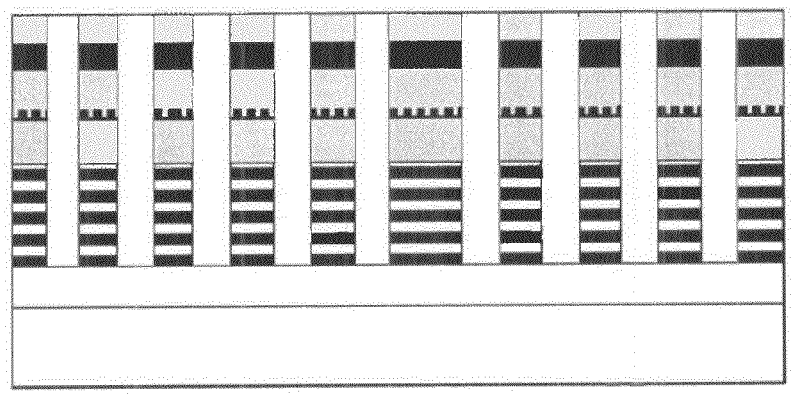
FIG. 19 shows a further fabrication stage of the device of FIG. 18.
Figure 20:
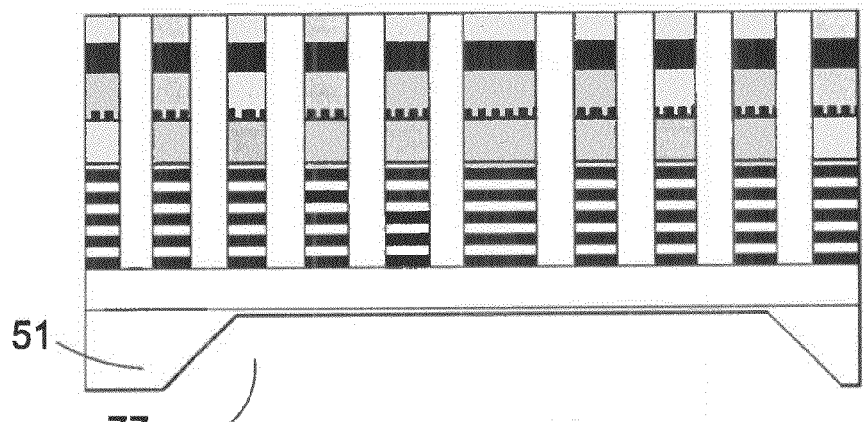
FIG. 20 shows a further fabrication stage of the device of FIG. 16.

FIGS. 18 to 20 show a further variation on the device. Here, the device is formed on an InP substrate 51. In this specific example, the substrate is semi-insulating 100 InP. A InP buffer layer 53 may optionally be formed overlying the substrate 51. Lower Bragg mirror 55 is then formed from alternating layers $Al_xGa_{1-x}As_ySb_{1-y}$ and $AlAs_ySb_{1-y}$ where y=0.5 and x=0.1. For $\lambda=1.55$ μm, thicknesses of 98.6 nm and 117 nm are used for $Al_xGa_{1-x}As_ySb_{1-y}$ and $AlAs_ySb_{1-y}$ layers respectively.

The upper 65 and lower 61 cavity layers can be formed from AlInAs or InGaAs. The quantum dot layer can be formed in both of these cases by depositing InAs. InAs has a substantially different lattice constant to that of AlInAs or InGaAs. Therefore, self-organised dots are formed on depositing InAs.

A phase matching layer 73 and top mirror layer 75 can be formed in the same way as described with reference to FIG.

15. In this particular example, the phase matching layer 73 will be formed from the same material as that of the cavity layers 61 and 65.

Holes will then be etched into the device through the upper mirror 75, cavity region 60 and lower Bragg mirror. Such an arrangement is shown in FIG. 19. This is achieved in the same way as described with reference to FIG. 16.

The substrate 51 can be partially etched as shown in FIG. 20 in order to form window 77 which can receive a fibre optic cable. It will be appreciated that this window could be formed on top of the device.

Other variations on the layers of lower Bragg mirror 55 are possible. In principle, any two materials which are lattice matched to InP and which have different refractive indices could be used. For example, the mirrors could comprise alternating layers of InP and InGasAsP. Another variation would be to use InP and $In_{0.52}Al_{0.48}As$. The system could be oxidised in a similar manner as described with reference to FIGS. 9 and 11 so that the InAlAs forms aluminium oxide.

In the previous examples, an optical cavity has been formed which serves to confine photons on a length scale of the order of photon wavelength. Inside this cavity, a photon generation portion has been formed which, may be a quantum dot. In the case where a quantum dot is formed within the cavity, we have the situation where there is 3D electronic confinement and 3D optical confinement. When the 3D optical confinement is optimised to confine a photon corresponding to the transition wavelength of the quantum dot, there is strong coupling between the electronic structure of the dot and the optical modes of the cavity. In this strong coupling regime, the quantum dot transition and the optical mode hybridise to form two coupled states.

Figure 21:
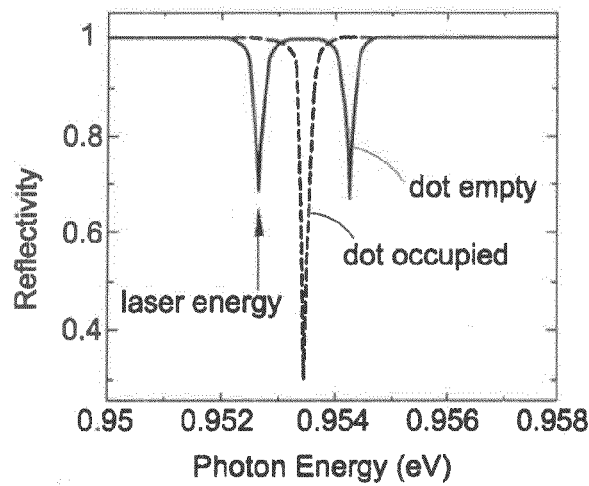
FIG. 21 shows a plot of reflectivity against incident wavelength of a device in accordance with an embodiment of the present invention.
Figure 22:
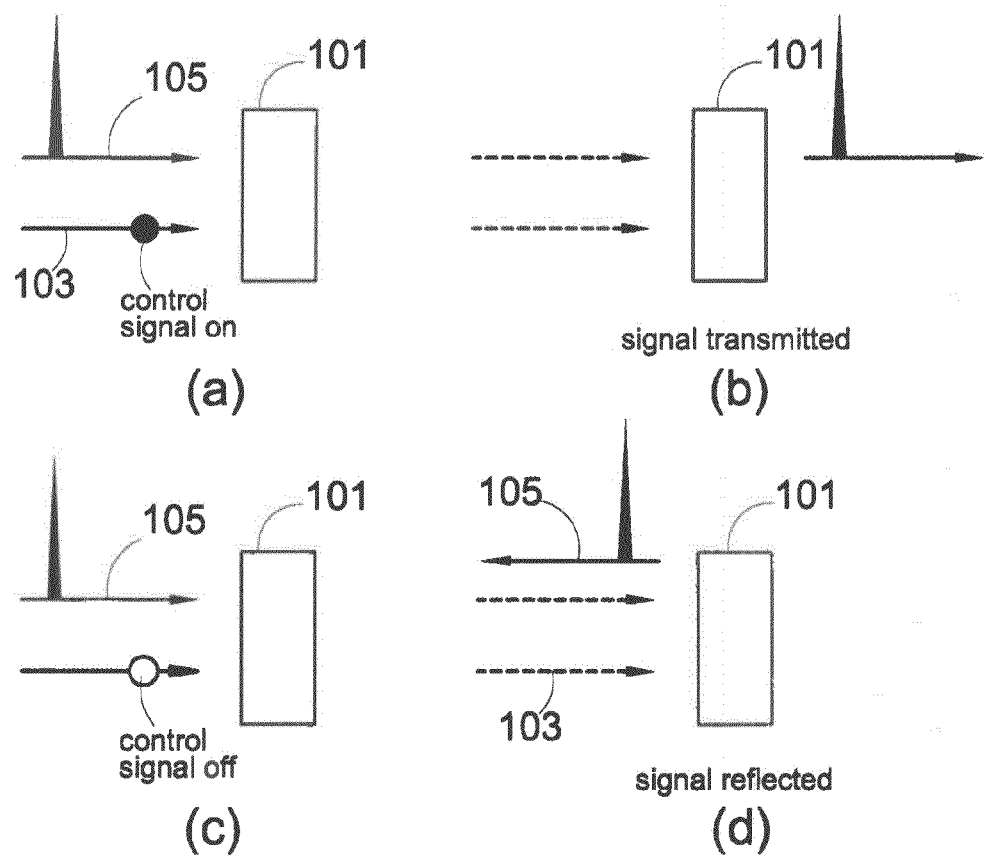
FIGS. 22a to 22d illustrate possible modes of operation of a device having the reflectivity characters of FIG. 21.

FIG. 21 plots the reflectivity of a device against the energy of incident photons on a device.

The cavity of the device of FIG. 21 has been designed to be resonant with the quantum dot transition, i.e. the energy of the allowed cavity mode $E_{cav}(=h\,c/\lambda)$ equals that of the quantum dot transition. The reflectivity spectrum of the structure shows two dips (solid line) due to the coupled modes of the quantum dot and cavity, at energies $(E_{cav}+\Omega)$ and $(E_{cav}-\Omega)$.

If the energy of the incident photons is tuned to the energy of one of the coupled modes a photon will be absorbed by the dot. The absorbed photon produces an electron-hole pair within the quantum dot, which blocks the absorption of further photons. Blocking the oscillator strength of the quantum dot turns off the coupling of dot and cavity mode, so that the reflectivity spectrum adopts a single central dip (dotted line). Further laser photons impinging on the device will then be reflected from the structure, until the photon trapped by the cavity is re-emitted. This property of the quantum dot 3D cavity, that it can only hold one photon at any time, can be thought of as the optical analogue of the Coulomb blockade effect, seen for electron pumping of a quantum dot.

The device of FIG. 21 can be used as an optical switch or transistor where the reflectivity/transmission of a single or multi-photon signal is controlled by a single photon. Such operation is shown diagrammatically in FIGS. 22A to D.

Here, the strongly coupled device 101 has a control signal 103 and a signal which is to be controlled 105. Control signal is a photon which has a wavelength which corresponds with either of the dips shown in the solid line of FIG. 21. The signal which is to be controlled has a wavelength which corresponds to that of the dip of the dotted line shown in FIG. 21.

Figure 23:
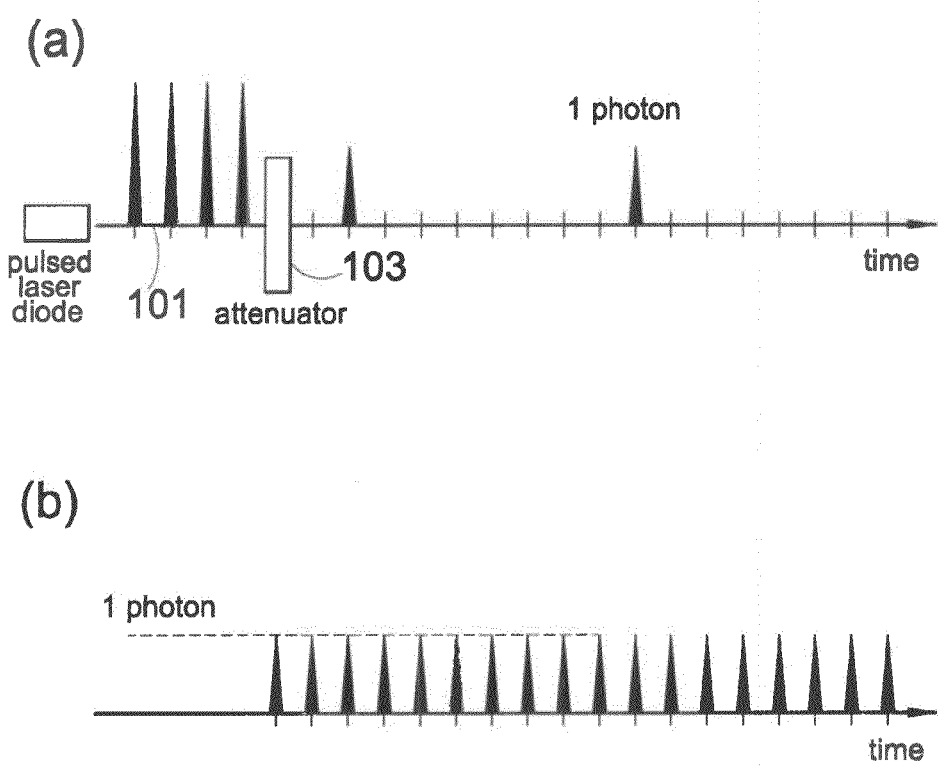
FIG. 23 shows a known single photon emitter.

In FIG. 22A, a control signal 103 is applied to device 101. The control signal is a single photon which has a wavelength which is equal to that of either of the solid line dips shown in FIG. 21. This control signal will be absorbed by device 101, changing the reflectivity characteristics of the device to that of the dotted line shown in FIG. 21. This means that signal 105, which has a wavelength equal to that of the minima of the dotted line in FIG. 21 is transmitted through the device as shown in FIG. 23B.

FIG. 22C shows the converse operation where no control signal is applied. Again, the main signal is supplied at the wavelength of the occupied dot, i.e. the minima of the dotted line of FIG. 21. As there is no control signal, the device 101 cannot absorb at this wavelength and main signal 105 is reflected as shown in FIG. 22D.

The advantage of such a device is that the switched beam can be controlled by a very weak control beam. Therefore, the device has extremely low power consumption.

The above device has many uses. For example, it can be used as an all-optical routing device in a fibre optic network. It can also be used for making an amplified copy of a weak optical signal which could be used as a repeater in a fibre optic network. For example, in the device of FIG. 22, the weak signal is a control signal and the amplified signal is the main signal 105.

The device of FIG. 21 can also be used to extract single photons from multi-photon signals. This is useful in a system for quantum cryptography, which uses an attenuated pulsed laser diode to generate the optical signals. The source is attenuated so that the average number of photons per pulse, $\mu\ll1$. However, a problem with such a source is that it still emits a large number of multi-photon pulses ($\mu^2/2$). The present device can be used to extract a single photon from each pulse. In this case the device is designed so that the energy of one of the coupled modes, for instance ($E_{cav}-\Omega$), coincides with the signal wavelength. When a multi-photon pulse is incident on the device, one of the photons will excite the quantum dot, thereby blocking the transition for the others, which are therefore reflected from device 101.

The invention claimed is:

1. An optical device configured to operate with pulses of n photons, where n can be controlled and is an integer of at least 1, the device comprising:

a quantum dot located within a three dimensional optical cavity configured to confine a photon to the order of the photon's wavelength in all three dimensions, the quantum dot and optical cavity being configured such that there is a strong coupling between the confined electronic modes of the quantum dot and the optical modes of the cavity;

wherein the three dimensional cavity is provided within a layer or a plurality of layers and optical confinement in one of the dimensions within the plane of the layer or the layers is provided by a pattern of reflective interfaces, the three dimensional optical cavity being formed at an irregularity of the pattern;

a source of a main beam of radiation; and a source of a control beam;

wherein the cavity and the quantum dot are arranged such that the optical response of the cavity to the main beam changes in response to an interaction between the control beam and the quantum dot.

2. The optical device according to claim 1, the energy of the main beam being different to that of the control beam.

3. The optical device according to claim 1, the main beam of radiation having an energy which is substantially equal to that of the cavity mode in the absence of the quantum dot.

4. The optical device according to claim 1, the control beam comprising at least one photon having an energy which is equal to one of the coupled modes between the three dimensional cavity and the dot.

5. An optical device configured to operate with pulses of n photons, where n can be controlled and is an integer of at least 1, the device comprising:
- a quantum dot located within a three dimensional optical cavity configured to confine a photon to the order of the photon's wavelength in all three dimensions, the quantum dot and optical cavity being configured such that there is a strong coupling between the confined electronic modes of the quantum dot and the optical modes of the cavity;
- wherein the three dimensional cavity is provided within a layer or a plurality of layers and optical confinement in one of the dimensions within the plane of the layer or the layers is provided by a pattern of reflective interfaces, the three dimensional optical cavity being formed at an irregularity of the pattern;
- a source of a main beam of radiation having an energy which is substantially equal to that of the cavity mode in the absence of the quantum dot; and
- a source of a control beam comprising at least one photon having an energy which is equal to one of the coupled modes between the three dimensional cavity and the dot, the energy of the main beam being different to that of the control beam.

6. A method of operating an optical device configured to operate with pulses of n photons, where n can be controlled and is an integer of at least 1, the device comprising:
- a quantum dot located within a three dimensional optical cavity configured to confine a photon to the order of the photon's wavelength in all three dimensions, the quantum dot and optical cavity being configured such that there is a strong coupling between the confined electronic modes of the quantum dot and the optical modes of the cavity;
- wherein the three dimensional cavity is provided within a layer or a plurality of layers and optical confinement in one of the dimensions within the plane of the layer or the layers is provided by a pattern of reflective interfaces, the three dimensional optical cavity being formed at an irregularity of the pattern, the method comprising the steps of:
- irradiating the device with a main beam of radiation, and selectively illuminating the quantum dot with a control beam in order to control whether the main beam is transmitted or reflected by the cavity.

7. The method according to claim 6, the energy of the main beam being different to that of the control beam.

8. The method according to claim 6, the main beam having an energy which is substantially equal to that of the cavity mode in the absence of the quantum dot.

9. The method according to claim 6, the control beam comprising at least one photon having an energy which is equal to one of the coupled modes between the three dimensional cavity and the dot.

* * * * *